United States Patent [19]
Strid et al.

[11] Patent Number: 4,858,160
[45] Date of Patent: Aug. 15, 1989

[54] SYSTEM FOR SETTING REFERENCE REACTANCE FOR VECTOR CORRECTED MEASUREMENTS

[75] Inventors: Eric W. Strid, Portland; Keith E. Jones, Beaverton, both of Oreg.

[73] Assignee: Cascade Microtech, Inc., Beaverton, Oreg.

[21] Appl. No.: 169,844

[22] Filed: Mar. 18, 1988

[51] Int. Cl.$^4$ .................. G06F 15/20; G01R 27/04; G01C 25/00

[52] U.S. Cl. .................. 364/571.01; 324/57 R; 324/58 B; 324/77 B; 364/481; 364/483; 364/487

[58] Field of Search ............ 324/57 R, 58 A, 58 R, 324/58 B, 73 AT, 73 R, 73 PC, 77 A, 77 B, 77 C, 158 F, 158 P; 364/480–487, 570, 571.01, 572, 550, 551.01, 553, 580

[56] References Cited

U.S. PATENT DOCUMENTS

| | | | |
|---|---|---|---|
| 4,507,602 | 3/1985 | Aguirre | 324/58 R |
| 4,588,970 | 5/1986 | Donecker et al. | 324/58 R |
| 4,680,538 | 7/1987 | Dalman et al. | 324/58 R |
| 4,703,433 | 10/1987 | Sharrit | 364/487 |

OTHER PUBLICATIONS

R. F. Bauer et al., "De-Embedding and Unterminating" IEEE Trans. on MTT, vol. MTT—22, pp. 282–288, (Mar. 1974).

J. Fitzpatrick, "Error Models for Systems Measurements" Microwave Journal, (May 1978).

E. Strid "Planar Impedance Standards and Accuracy Considerations in Vector Network Analysis" (Jun. 1986).

Primary Examiner—Parshotam S. Lall
Assistant Examiner—Kevin Teska
Attorney, Agent, or Firm—Chernoff, Vilhauer, McClung & Stenzel

[57] ABSTRACT

A system for calibrating vector corrected electrical measurements to adjust for distortion due to reactance in the measuring circuit, particularly that caused by variable positioning of a circuit element, such as probe or coupling. Initial error factors for directivity, source match, and frequency response, respectively, normally calculated from assumed reflection coefficients of respective primary impedance standards, are adjusted to correct for such reactance. Reflection coefficient measurements (magnitude and phase) of a further impedance standard, different from the primary standards, are obtained at multiple frequencies and corrected by the initial error factors. The corrected magnitude and phase measurements of the further impedance standard are compared with theoretical magnitude and phase values which very linearly with frequency, and the initial error factors are adjusted so as to minimize any deviation of the corrected measurements from the linear values. Thereafter, by positioning the probe or other circuit element relative to a device under test substantially identically to its previous placement relative to the further impedance standard, the adjusted error factors can be used to obtain corrected measurements with minimized magnitude and phase errors due to reactance.

19 Claims, 4 Drawing Sheets

SHORT STANDARD

LOAD (TERM) STANDARD

OPEN STANDARD

OPEN STUB STANDARD

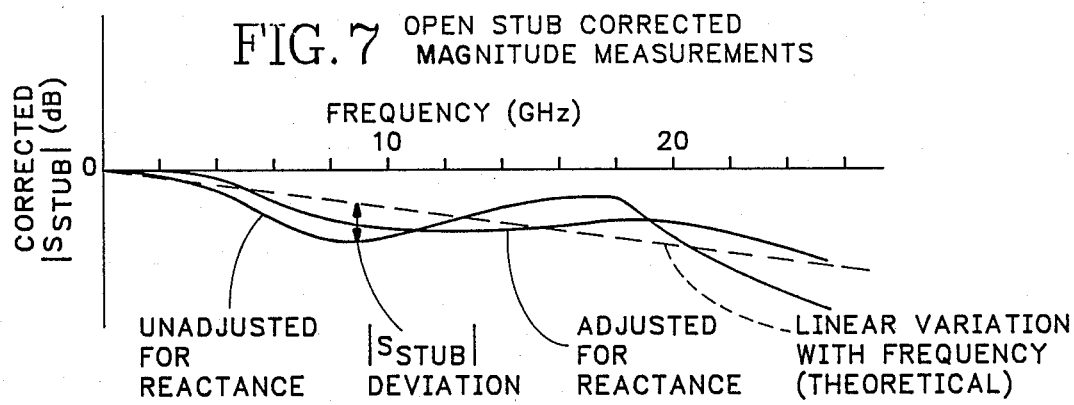
FIG. 7 OPEN STUB CORRECTED MAGNITUDE MEASUREMENTS
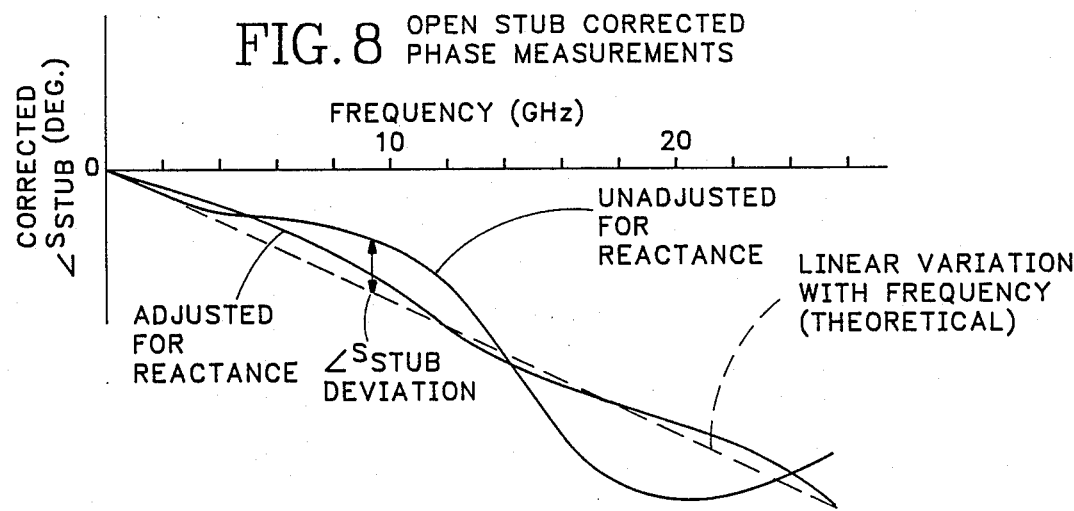
FIG. 8 OPEN STUB CORRECTED PHASE MEASUREMENTS
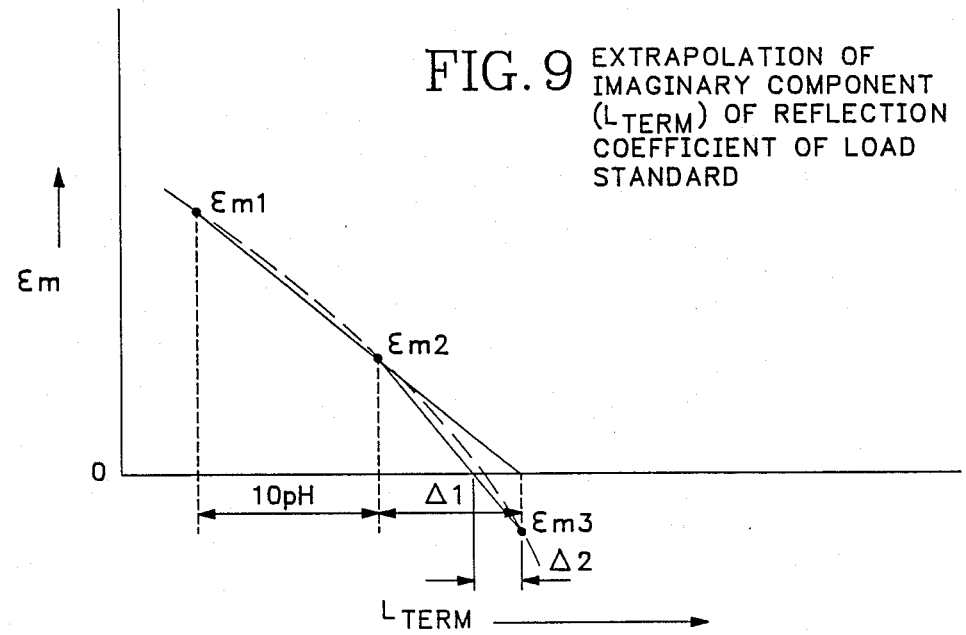
FIG. 9 EXTRAPOLATION OF IMAGINARY COMPONENT ($L_{TERM}$) OF REFLECTION COEFFICIENT OF LOAD STANDARD

SYSTEM FOR SETTING REFERENCE REACTANCE FOR VECTOR CORRECTED MEASUREMENTS

BACKGROUND OF THE INVENTION

This invention relates to vector corrected measurements of microwave circuits. More specifically, the invention provides a system for adjusting error factors, normally used to correct such measurements, to compensate for distortions due to imperfect assumptions of the value of reflection coefficients of impedance standards. Such imperfect assumptions may be caused, for example, by reactance in the measuring circuit due to variable positioning of circuit elements, such as probes, couplings, and the like.

Microwave measurements of very small planar circuits require highly accurate measurements of complex (magnitude and phase) reflection and transmission coefficients. The measurement system, whether used in a one-port or two-port mode, is subject to three major sources of repeatable errors correctable by complex error factors referred to as directivity (Ed), frequency response (Er), and source match (Es). The basic approach to determining and using such error factors is widely published, as exemplified by R. F. Bauer et al. "De-embedding and Unterminating", *IEEE Trans. on MTT*, Volume MTT-22, pages 282–288 (Mar. 1974), and J. Fitzpatrick, "Error Models For Systems Measurement," *Microwave Journal* (May 1978). It is well known that these three error factors Ed, Es, Er are mathematically related to the actual one-port reflection coefficient Sa and the measured one-port reflection coefficient Sm by the following equation (or variations thereof):

$$Sm = Ed + \frac{SaEr}{1 - EsSa}$$

If the three error factors are known for the particular test frequency, the measured reflection coefficient Sm (magnitude and phase) can be corrected by solving the above equation for the actual reflection coefficient Sa.

In practice, values of the three error factors are conventionally determined by measuring the reflection coefficients (at the test frequencies of interest) of three independent primary impedance standards whose actual reflection coefficients are assumed to be known constants at all frequencies. Although different impedance standards may be used, the ones most commonly employed are the open-circuit, short-circuit, and load (termination) impedance standards whose actual reflection coefficients for purposes of calculating the error factors are assumed to be 1, −1, and 0, respectively (or with slight known offsets). The measured reflection coefficient Sm of the load standard is used to find Ed from the above equation. Thereafter, the equation can be solved simultaneously for the remaining two error factors Es and Er using the measurements Sm of the open and short standards, respectively.

The foregoing three assumed reflection coefficients of the impedance standards presume the absence of any unknown reactance affecting their reflection coefficients. However, it has been recognized that reactance does in fact affect such measurements and that the standards' reflection coefficients are therefore not completely known. In a technical paper by E. Strid, "Planar Impedance Standards and Accuracy Considerations in Vector Network Analysis" (June 1986), the effect of reactance on the assumed reflection coefficients of the foregoing impedance standards, and the resultant inaccuracies in error factor calculations, is discussed. Reactance affecting the measurements of the reflection coefficients of the open and short impedance standards is described as producing phase errors in the error factors, and thus phase errors in the ultimate corrected measurements of devices under test. On the other hand, reactance affecting the measurement of the reflection coefficient of the load impedance standard produces magnitude errors in the calculation of the error factors, and thus magnitude errors in the ultimate corrected measurements. However, the nature and values of the reactances, their variability with changes in position of a circuit element such as a probe, and the combined effects of two or more of these reactances have been difficult both to quantify and to interrelate. Accordingly, it has not previously been known how to adjust the error factors in a systematic or mutually compatible manner to compensate accurately for both magnitude and phase distortions caused by such reactances.

SUMMARY OF THE INVENTION

The present invention solves the aforementioned problem of error factor adjustment by providing a system for setting a reference reactance, analogous to a reference plane but with an inductive or capacitive element, at the point of connection to a device under test so as to compensate for distortions in measurements caused by reactance, especially that due to probe or other circuit element placement but not limited thereto. The system stems from the realization that any test device or impedance standard contacted by a measuring circuit has (to the first order) a variable inductance in series with the device or standard due to, and varying with, placement of the contacting circuit element such as a probe tip. Such series inductance decreases with increasing overlap between the contacting circuit element and the device or standard. Parallel capacitance is not likewise affected by such overlap (to the first order). Such series inductance is what is referred to herein as the reference reactance.

The present invention quantifies the series inductance by using the variable-position probe or other circuit element to measure the magnitudes and phases of respective reflection coefficients, at different frequencies, of a further (i.e., fourth) impedance standard, different from the three primary impedance standards, and utilizing the initial error factors (unadjusted for such inductance) to correct such measurements. Thereafter, distortions in magnitude and phase of the corrected measurements of the further standard due to the inductance are determined, and the initial error factors are adjusted to minimize such distortions by adjusting the assumed reflection coefficients of at least two of the three primary impedance standards with respect to their imaginary components, so as to recalculate the error factors. When the recalculated error factors are subsequently used to correct one-port or two-port measurements on devices under test, with the probe or other circuit element positioned with an overlap substantially identical to that previously used to measure the further impedance standard, any magnitude and phase distortions due to reactance caused by positioning of the probe or other circuit element will be minimized.

The calibration system of the present invention is rendered particularly efficient and rapid by systematizing the adjustment of the respective assumed reflection coefficients of the two primary impedance standards. The respective reflection coefficients are adjusted by respective imaginary increments related to each other by a predetermined ratio, so that both adjustments converge compatibly toward the desired result of minimizing magnitude and phase distortions. Moreover, when particular adjustment increments do not completely accomplish the desired result, extrapolation is used to predict what further adjustment is necessary.

Preferably, distortions in the measurement of the reflection coefficients of the further (fourth) impedance standard are determined by comparing the corrected magnitude and phase measurements thereof with corresponding theoretical values which vary substantially linearly with frequency, and using the deviations of the corrected magnitude and phase measurements from the theoretical values to quantify the distortions. In this connection, the invention recognizes that phase deviations from the theoretical values can also be caused by imperfect impedance of the further impedance standard, and provides a means of removing from such deviations the variable component thereof caused by variations in such impedance.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 7 is a graph illustrating exemplary corrected reflection coefficient magnitude measurements of the open stub standard of FIG. 5, both unadjusted and adjusted for reactance.

FIG. 8 is a graph illustrating exemplary corrected reflection coefficient phase measurements of the open stub standard of FIG. 5, both unadjusted and adjusted for reactance.

FIG. 9 is a graph exemplifying the use of extrapolation to adjust the imaginary component of the reflection coefficient of the load impedance standard.

DESCRIPTION OF THE PREFERRED EMBODIMENT

Figure 1:
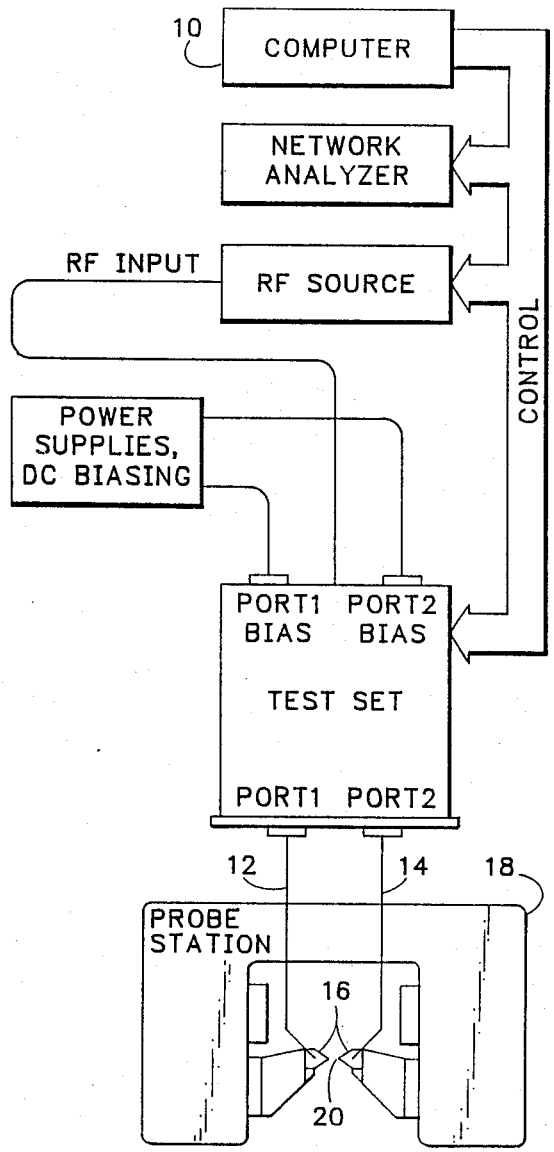
FIG. 1 is a simplified schematic diagram of a typical computer-operated network analyzer and associated probe station for measuring microwave integrated circuits.

A typical block diagram of a conventional network analyzer for measuring microwave integrated circuits (such as a Hewlett Packard model HP8510 analyzer), is shown in FIG. 1. The analyzer may be controlled by its own computer 10 or, alternatively, by an external computer, and is connected by transmissions lines 12, 14 to respective probe heads 16 of a conventional probe station 18. Each probe head 16 has a respective probe tip 20 for contacting and performing measurements on integrated circuits and impedance standards. The probe tip 20 may be of the coplanar wave guide type shown, for example, in U.S. Pat. No. 4,697,143, which is incorporated herein by reference. The probe tip 20 shown in FIGS. 2–5 is of a relatively simple coplanar type having one signal conductor 22 and a pair of ground conductors 24.

Figure 2:
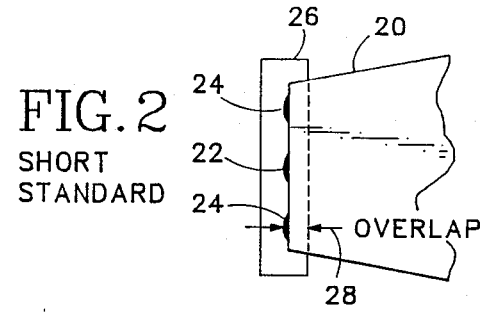
FIG. 2 is a top view of an exemplary coplanar wave guide probe tip shown measuring the reflection coefficient of a typical short-circuit impedance standard.
Figure 3:
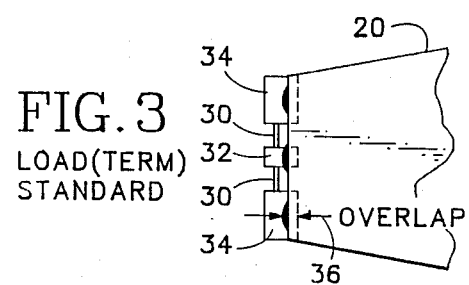
FIG. 3 is a top view of the same probe tip shown measuring the reflection coefficient of a typical load impedance standard.
Figure 4:
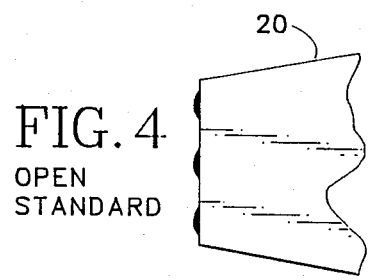
FIG. 4 is a top view of the same probe tip shown measuring the reflection coefficient of an open-circuit impedance standard.

For purposes of conventional determination of the three initial error factors Ed, Er, and Es, three primary impedance standards provided on an impedance standard substrate are contacted by the probe tip 20 to measure their respective reflection coefficients. A typical short-circuit standard as shown in FIG. 2 is a planar conductive strip 26 contacted in unison by the signal conductor 22 and ground conductors 24 of the probe tip 20. The variable reactance component of the measurement is caused principally by the variable distance 28 by which the probe tip overlaps the edge of the short-circuit strip 26. A typical exemplary load standard is shown in FIG. 3, and comprises a pair of 100 ohm resistors 30 separating a signal conductor 32 from a pair of ground conductors 34. Similarly, the reactance variable is caused primarily by the variable overlap distance 36. The open-circuit standard, as depicted in FIG. 4, is preferably created by lifting the probe tip 20 at least ten mils into the air above the impedance standard substrate. The open standard is unaffected by probe placement since no interaction of the probe tip with another device is necessary, and whatever reactance may exist in the measurement of the open standard is therefore relatively fixed. However, even though the reactance of this standard is not physically variable, it is possible to vary it mathematically as part of the adjustment system of the present invention if desired.

Figure 5:
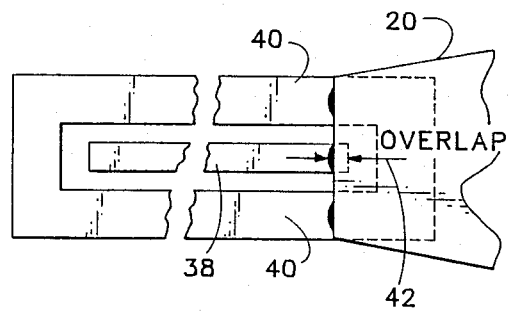
FIG. 5 is a top view of the same probe tip shown measuring the reflection coefficient of a typical open stub impedance standard.

In addition to the foregoing three primary impedance standards, the system of the present invention utilizes a fourth impedance standard. The fourth standard may be an open or shorted stub, a high-Q capacitor, or a high-Q inductor. A typical open-stub standard is depicted in FIG. 5, comprising a relatively long central planar signal conductor strip 38 with a pair of ground conductor strips 40 on either side thereof electrically isolated therefrom. Again, variable reactance affecting the measurement of the reflection coefficient of the open stub depends on the probe tip overlap distance 42. After the initial error factors have been adjusted by the system of the present invention to compensate for the reactance caused by the overlap distance 42, such overlap distance will be maintained in subsequent measurements by the probe tip 20 of devices under test, so that the same reactance is maintained and the adjusted error factors can thereby accurately compensate for such reactance in the subsequent measurements.

Figure 6A:
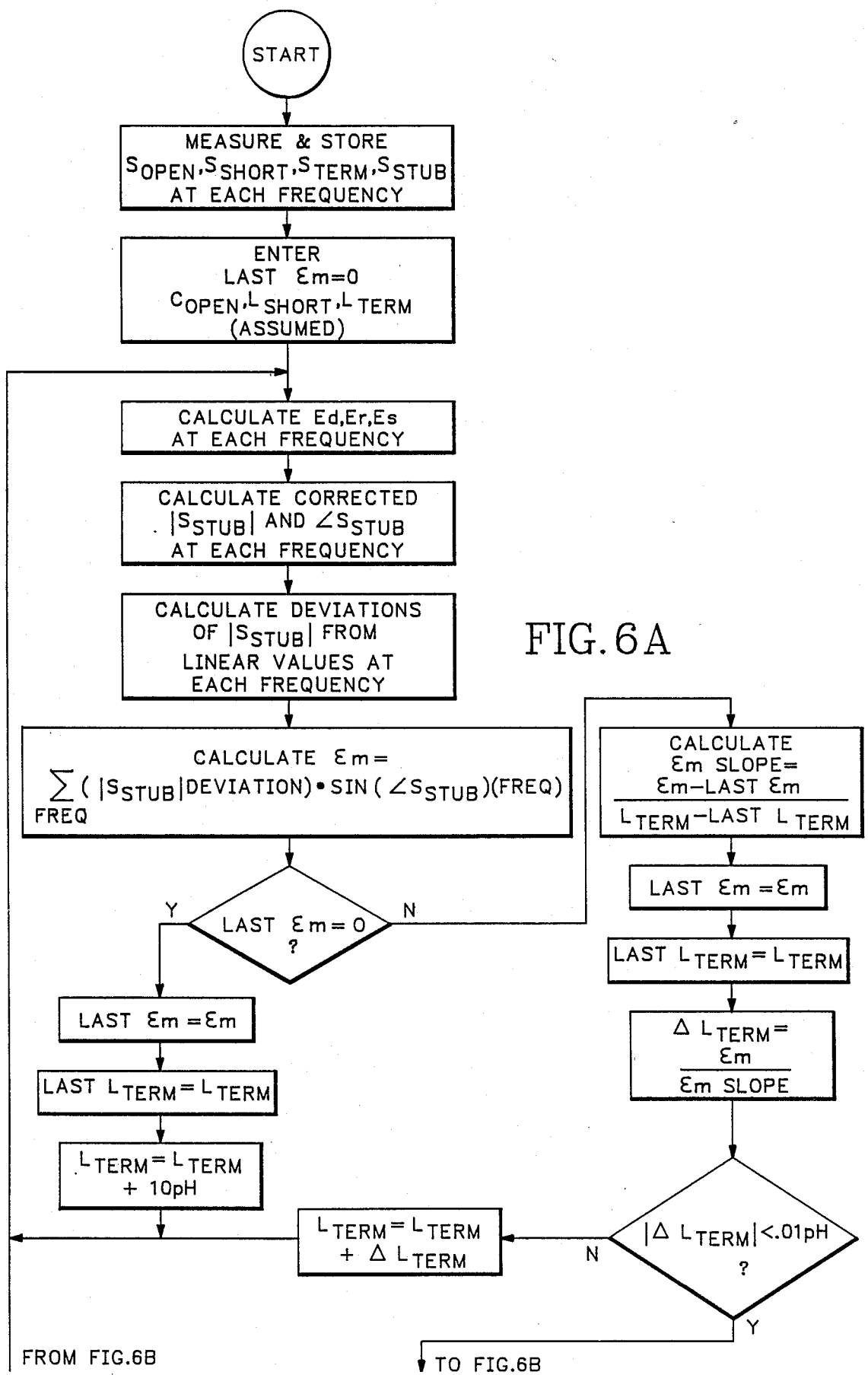
FIGS. 6A and 6B depict an exemplary, simplified logic flow chart in accordance with which a standard general-purpose computer may be programmed to perform error factor adjustments in accordance with the system of the present invention.
Figure 6B:
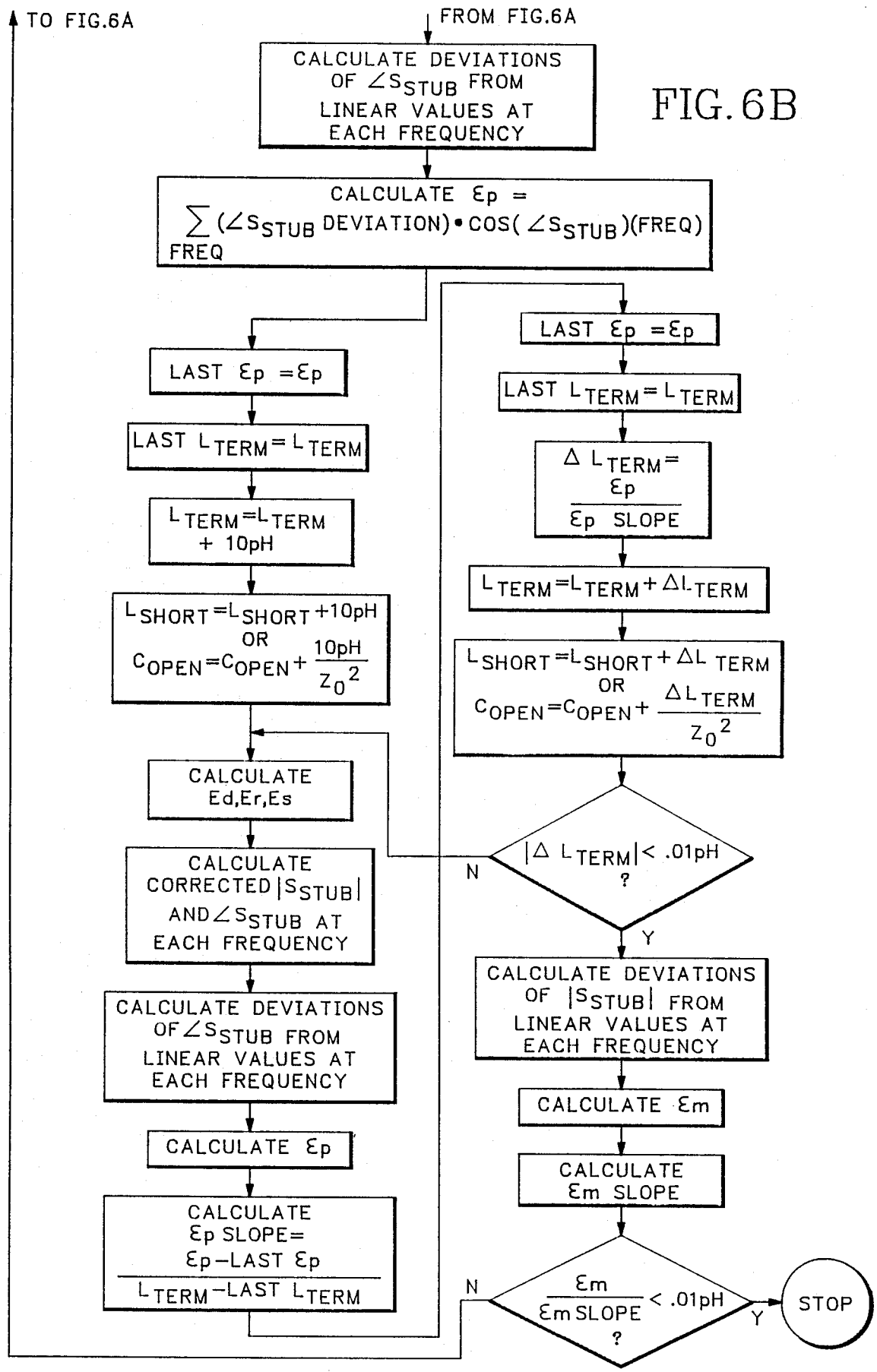

FIGS. 6A and 6B show an exemplary simplified logic flow diagram in accordance with which the computer 10 is programmed to perform the adjustment of the initial error factors Ed, Er and Es to correct for reflection coefficient magnitude and phase distortions caused by probe positioning during the measurement of the reflection coefficients of the impedance standards. First, the reflection coefficients S open, S short, S term, and S stub of the standards are measured and stored at each frequency for which subsequent measurements of devices under test will be made. The assumed imaginary components of the reflection coefficients of the three primary impedance standards are then entered (C open, L short, L term). There may all be zero, in which case the assumed reflection coefficients of the open, short and load standards will be 1, −1, and 0, respectively. Alternatively, a known imaginary component such as that for the open standard may be entered if known. In any case, the initial error factors Ed, Er, and Es are then calculated in the conventional manner for each frequency using the equation set forth in the Background of the Invention. Once the three initial error factors are known for each frequency, measurements at each frequency of the magnitude and phase of the reflection coefficient of the open stub impedance standard are corrected by the initial error factors to find actual |S stub| (magnitude) and actual <S stub (phase) for each frequency. These corrected measurements will yield the "unadjusted for reactance" curves of FIG. 7 (magnitude) and FIG. 8 (phase), respectively. In the absence of reactance in the corrected measurements, the corrected magnitude should ideally decrease monotonically in proportion to the square root of the frequency, and the rate of change of the phase with frequency should be substantially linear. Accordingly, distortion in each corrected measurement due to the presence of such reactance is determined by comparing the corrected magnitude and phase measurements with theoretical values thereof, at the same frequencies, which vary substantially linearly with frequency. (With respect to magnitude, the linear theoretical function represents an approximation of the ideal square root function, with acceptably small error over the majority of the frequency range, permitting simpler, more rapid calculation.) These linear theoretical values are represented by the dashed "linear variation" lines of FIG. 7 and 8, respectively, which are drawn so as to have respective slopes equal to the respective frequency-averaged slopes of the corresponding "unadjusted for reactance" curves. Thereafter, deviation between the corrected and theoretical magnitude curves in FIG. 7, and deviation between the corrected and theoretical phase curves in FIG. 8, are calculated at each frequency.

It does not matter whether magnitude deviations or phase deviations are considered first; however, for purposes of explanation, it will be assumed that magnitude deviations are analyzed first. The respective positive or negative value of the stub magnitude deviation at each measurement frequency is multiplied by the positive or negative sine of the corresponding phase measurement at such frequency. The results are then summed to produce a total magnitude deviation $\epsilon m1$ (FIG. 9) over the measurement frequency range. Since $\epsilon m$ has not previously been calculated, the last $\epsilon m$ will be zero. Therefore, in accordance with the logic flow chart of FIG. 6A, the imaginary component (L term) of the reflection coefficient of the load standard is increased by an arbitrary amount (e.g. 10pH), and Ed, Er and Es are recalculated. The resultant corrected |S stub| and <S stub are likewise recalculated for each frequency, and $\epsilon m2$ is then calculated, producing two different values of $\epsilon m$ as shown in the graph of FIG. 9 at two different imaginary (L term) values, separated by an increment of 10pH, of the reflection coefficient of the load standard. From these values of $\epsilon m1$ and $\epsilon m2$ a further imaginary increment $\Delta 1$ can be extrapolated so as to yield an $\epsilon m3$ intended to be zero (corresponding to minimum corrected magnitude deviation from linear, and thus minimum magnitude distortion). However, if the imaginary increment $\Delta 1$ resulting from this extrapolation is not less than a predetermined minimum (such as 0.01pH), $\epsilon m3$ is calculated at the last imaginary value, yielding a further extrapolation from $\epsilon m2$ and so on until a final increment (such as $\Delta 2$), in the imaginary value (L term) of the reflection coefficient of the load standard, is reached which is below the predetermined minimum.

Thereafter, as shown in FIG. 6B, a calculation similar to that for $\epsilon m$ is made with respect to the positive or negative value of the stub phase deviation at each frequency, multiplied by the positive or negative cosine of the corresponding phase measurement at such frequency. The results are summed to produce a total phase deviation $\epsilon 1$ over the frequency range, representing the effects of the last recalculation of Ed, Er and Es. (The cosine function removes from the phase deviation calculation that component thereof which is due to any imperfection in the impedance Zo of the stub.) Then the imaginary component (L term) of the reflection coefficient of the load standard is changed by a further arbitrary increment (such as 10pH), but in this case the imaginary component of the reflection coefficient of one of the other primary impedance standards is changed simultaneously as well. As shown in FIG. 6B, the imaginary component (L short) of the short impedance standard can be changed by the same increment as that of the load standard or, alternatively, the imaginary component (C open) of the open impedance standard can be changed by an increment whose ratio to the load imaginary increment is inversely proportional to the square of the impedance Zo of the calibration. The three error factors are again recalculated, a new $\epsilon p2$ is calculated and extrapolation from $\epsilon p2$ and $\epsilon p1$ yields a further imaginary increment in the reflection coefficient of the load standard. If this further increment is not below a predetermined minimum, further calculations of $\epsilon p$ and further extrapolations are performed until the increment is below the minimum, after which $\epsilon m$ is recalculated using the last recalculation of the error factors. A further extrapolation with respect to $\epsilon m$ is performed to determine whether it continues to indicate only a small imaginary increment below the predetermined minimum. If not, extrapolations with respect to $\epsilon m$ and $\epsilon p$ are repeated; but if so, the calibration procedure is complete and the last-recalculated error factors at each frequency are the ones subsequently used in correcting measurements of devices under test at the same frequency. In the latter case, the measurements of the test devices are performed with the overlap of the probe tip with respect to the device being identical to the overlap distance 42 (FIG. 5) with which the probe tip measured the reflection coefficients of the open stub standard at the different frequencies.

As a result of the adjustments of the error factors to compensate for reactance, the open stub magnitude and phase deviations from linear should be minimized such that the corrected magnitude and phase values are represented by curves such as the "adjusted for reactance" curves of FIG. 7 and FIG. 8, respectively, which are much closer to linear.

It will be noted that, in the above procedure, the reflection coefficients of only two of the three primary impedance standards are adjusted to produce adjusted error factors. In one embodiment the imaginary components of the coefficients of the load and short standards are adjusted, while in another embodiment the imaginary components of the coefficients of the load and open standards are adjusted. The unchanged reflection coefficient of the third primary impedance standard defines the reference plane for measurement purposes.

Although in both embodiments just described the imaginary component (L term) of the reflection coefficient of the load standard is adjusted, this need not necessarily be the case. The reflection coefficient of the load standard could, alternatively, be fixed to define the reference plane and adjustments necessary to minimize εm and εp could be accomplished by changing the reflection coefficients of the open and short impedance standards.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of calibrating vector corrected electrical measurements by adjusting initial error factors, calculated from assumed reflection coefficients of respective impedance standards, so as to correct for distortions due to imperfect assumptions of the values of said reflection coefficients, said method comprising:
    (a) measuring magnitudes and phases of respective complex reflection coefficients, at respective multiple frequencies, of at least one further impedance standard;
    (b) utilizing said initial error factors to calculate corrected measurements of said magnitudes and phases;
    (c) determining the presence of any of said distortions in said corrected measurements of both said magnitudes and said phases; and
    (d) adjusting said initial error factors, and thereby adjusting said corrected measurements of said magnitudes and phases, so as to minimize said distortions.

2. The method of claim 1 wherein step (d) comprises adjusting said initial error factors and calculating therefrom resultant adjusted corrected measurements of said magnitudes and phases, respectively, repeating step (c) with respect to said adjusted corrected measurements to determine any distortions therein, and thereafter extrapolating a further adjustment of said initial error factors.

3. The method of claim 1 wherein said further impedance standard is an open stub.

4. The method of claim 1 wherein said further impedance standard is a shorted stub.

5. The method of claim 1 wherein said further impedance standard is a high-Q capacitor.

6. The method of claim 1 wherein said further impedance standard is a high-Q inductor.

7. The method of claim 1 wherein step (c) comprises comparing said corrected measurements of said magnitudes and phases with corresponding theoretical values of said magnitudes and phases which vary substantially linearly with frequency, and detecting any magnitude deviation and phase deviation between said corrected measurements and said theoretical values, and wherein step (d) comprises adjusting said initial error factors, and thereby adjusting said corrected measurements, so as to minimize said magnitude deviation and phase deviation.

8. The method of claim 7 wherein step (c) includes calculating at least one of said magnitude deviation and phase deviation at different ones of said multiple frequencies and summing the results of the calculations of said one of said deviations at said multiple frequencies.

9. The method of claim 7 wherein step (c) includes removing from said phase deviation a variable component thereof cause by any variation in the value of the impedance of said further impedance standard.

10. The method of claim 1 wherein step (d) comprises adjusting said initial error factors by adjusting the respective assumed reflection coefficients obtained from two of said respective impedance standards.

11. The method of claim 10 wherein step (d) further comprises adjusting the respective assumed reflection coefficients obtained from said two of said impedance standards by respective increments related to each other by a predetermined ratio.

12. The method of claim 10 wherein step (d) further comprises adjusting the respective assumed reflection coefficients obtained from said two of said impedance standards simultaneously.

13. The method of claim 10 wherein said respective impedance standards comprise open, load and short impedance standards respectively, and wherein the at least two impedance standards of step (d) are the open and the short impedance standards, respectively.

14. The method of claim 10 wherein said respective impedance standards comprise open, load and short impedance standards respectively, and wherein the at least two impedance standards of step (a) are the load and short impedance standards, respectively.

15. The method of claim 14 wherein step (d) comprises adjusting the assumed reflection coefficients obtained from said load and short impedance standards by equal increments.

16. The method of claim 10 wherein said respective impedance standards comprise open, load and short impedance standards, respectively, and wherein the at least two impedance standards of step (d) are the load and the open impedance standards, respectively.

17. The method of claim 16 wherein step (d) comprises adjusting the assumed reflection coefficients obtained from the load and open impedance standards by respective load and open increments, the ratio of the load increment to the open increment being proportional to the square of the impedance of said further impedance standard.

18. A method of calibrating vector corrected electrical measurements by adjusting initial error factors, calculated from assumed reflection coefficients of respective impedance standards, so as to correct for distortion due to reactance variations caused by variations in the positioning of a circuit element used in such measurements, said method comprising:
    (a) positioning and using said circuit element to measure magnitudes and phases of respective complex reflection coefficients, at respective multiple frequencies, of at least one further impedance standard;

(b) utilizing said initial error factors to calculate corrected measurements of said magnitudes and phases;
(c) determining the presence of any distortions in said corrected measurements, of both said magnitudes and said phases, due to reactance caused by the positioning of said circuit element in step (a); and
(d) adjusting said initial error factors, and thereby adjusting said corrected measurements of said magnitudes and phases, so as to minimize said distortions.

19. The method of claim 18, further including performing a measurement on a device under test by positioning said circuit element relative to said device in a manner substantially identical to the positioning of said circuit element relative to said further impedance standard in step (a), and utilizing adjusted error factors resulting from step (d) to correct said measurement on said device.

* * * * *

UNITED STATES PATENT AND TRADEMARK OFFICE
CERTIFICATE OF CORRECTION

PATENT NO. : 4,858,160

DATED : August 15, 1989

INVENTOR(S) : Eric W. Strid et al.

It is certified that error appears in the above-identified patent and that said Letters Patent is hereby corrected as shown below:

Col. 5, line 11    Change "There" to --These--

Col. 6, line 22    Change "$\epsilon 1$" to --$\epsilon\, p1$--

Col. 8, lines 19-20    Insert --at least-- between "from" and "two"

Col. 8, line 38    Change "(a)" to --(d)--

Signed and Sealed this

Sixth Day of August, 1991

*Attest:*

HARRY F. MANBECK, JR.

*Attesting Officer*      *Commissioner of Patents and Trademarks*